United States Patent
Nishimura

(10) Patent No.: US 7,591,873 B2
(45) Date of Patent: Sep. 22, 2009

(54) METHOD OF COPPER PRECIPITATION IN LEAD-FREE SOLDER, GRANULATION AND SEPARATION OF $(CUX)_6SN_5$ COMPOUNDS AND RECOVERY OF TIN

(75) Inventor: Tetsuro Nishimura, Osaka (JP)

(73) Assignee: Nihon Superior Sha Co., Ltd. (JP)

( * ) Notice: Subject to any disclaimer, the term of this patent is extended or adjusted under 35 U.S.C. 154(b) by 0 days.

(21) Appl. No.: 11/995,955

(22) PCT Filed: Jul. 25, 2006

(86) PCT No.: PCT/JP2006/314634

§ 371 (c)(1), (2), (4) Date: Jan. 17, 2008

(87) PCT Pub. No.: WO2007/013433

PCT Pub. Date: Feb. 1, 2007

(65) Prior Publication Data

US 2008/0216605 A1 Sep. 11, 2008

(30) Foreign Application Priority Data

Jul. 26, 2005 (JP) ............................. 2005-215946

(51) Int. Cl.
*C22B 9/02* (2006.01)
(52) U.S. Cl. .......................................... 75/407; 75/411
(58) Field of Classification Search ........................ None
See application file for complete search history.

(56) References Cited

U.S. PATENT DOCUMENTS

2003/0234453 A1* 12/2003 Liu et al. ..................... 257/778

FOREIGN PATENT DOCUMENTS

| JP | 11-106845 | 4/1999 |
| JP | 11-333589 | 12/1999 |
| JP | 2005-042191 | 2/2005 |

OTHER PUBLICATIONS

International Search Report issued regarding International Application No. PCT/JP2006/314634 (Aug. 15, 2006).
International Preliminary Report on Patentability issued regarding International Application No. PCT/JP2006/314634 (Feb. 7, 2008).

* cited by examiner

*Primary Examiner*—Melvin C Mayes
*Assistant Examiner*—Sarah Van Oudenaren
(74) *Attorney, Agent, or Firm*—Thompson Hine LLP

(57) ABSTRACT

The purpose of the present invention is to separate excess coppers leached out in a lead-free solder bath and recover tin with high efficiency. An element X for forming a $(CuX)_6Sn_5$ compound between copper and tin in molten lead-free solders is added to separate out a $(CuX)_6Sn_5$ compound. Tin is recovered by binding the $(CuX)_6Sn_5$ compound by passing thereof through a multi-perforated plate, further generating swirling currents to precipitate and separate the bound $(CuX)_6Sn_5$ compounds and removing thereof.

6 Claims, 4 Drawing Sheets (a)

(b)

(c)

(a)

(b)

(c)

METHOD OF COPPER PRECIPITATION IN LEAD-FREE SOLDER, GRANULATION AND SEPARATION OF $(CUX)_6SN_5$ COMPOUNDS AND RECOVERY OF TIN

TECHNICAL FIELD

The present invention relates to separating excess copper leached out in a lead-free solder bath and recovering tin from thence in a soldering process of such as a printed board having a copper foil and a surface-mounted component having a copper lead wire.

BACKGROUND OF THE ART

Lead-free solder consists chiefly of tin and contains appropriate amount of copper, silver, nickel, bismuth, indium, phosphorus and germanium. Usually, a wetting phenomenon starts around a temperature range of 250° C. and therefore, a soldering process is performed by immersing members of a printed board and so on in a solder bath heated to the mentioned temperature range or contacting members of a printed board and so on with molten solder spouting formed in a solder bath.

However, copper used for a lead wire of a printed board, a member and so on is heated to the mentioned temperature range in the soldering process and elutes into solder. This phenomenon is so-called "copper leaching". When copper leaching occurs, surface tension and fluidity of molten solder are affected as a copper concentration in a solder bath rapidly leads to raise a melting point of solder. As a result, a defect such as a solder bridge, a perforated solder, unsoldering, a cornuted solder, an icicle-formed solder and so on is caused leading to deterioration of solder quality.

Therefore, when a copper concentration in a solder bath rises, a part or a whole of solder in the solder bath are to be replaced. Used solder extracted in this process is discarded as it is or Sn is recovered by executing some additional process to reutilize as solder material.

As a recovering method of Sn, conventionally, a method utilizing melting point difference, an electrolytic refining method and so on are used.

DISCLOSURE OF INVENTION

Problems to be Solved by the Invention

As a conventional Sn recovering method requires a large-scale facility leading to need for a large installation and further, an equipment such as a heater consuming flame and large electricity is necessary to maintain a temperature of an unrefined object high. This forces a dangerous and inefficient operation.

The present invention is to solve the above problem and the purpose thereof is to provide a method for separating excess copper leached out in a lead-free solder bath and recovering tin from thence.

Means to Solve the Problem

The inventor of the present invention devoted himself to research and came to have the following findings.

(1) When an adequate amount of elements of Ni, Co, Fe and so on are added, copper may separate out as a $(CuX)_6Sn_5$ compound (X is an element such as Ni, Co and Fe). Sn can be recovered by separating this $(CuX)_6Sn_5$ compound.

(2) However, as a particle of the $(CuX)_6Sn_5$ compound is small and floats in solder, recovery is not easy. When the compound is left for a long time resulting in precipitation, recovery becomes easy but this entails an increase in an energy cost since a solder melting temperature of 230~250° C. ought to be maintained for a long time. Consequently, granulation and precipitation of $(CUX)_6Sn_5$ compounds is efficient as a method for separating and removing thereof.

As a result of accumulated researches based on the above findings, the inventor of the present invention has completed the present invention enabling to separate excess copper leached out in a lead-free solder bath and recover tin with high efficiency from thence.

A subject-matter of the present invention is a method of copper precipitation in lead-free solder as described in the following (a), a method of granulation of $(CuX)_6Sn_5$ compounds as described in the following (b), a method of separation of $(CuX)_6Sn_5$ compounds as described in the following (c) and a method of recovering tin as described in the following (d).

(a) A method of copper precipitation in lead-free solder for separating out copper leached out in lead-free solder as an intermetallic compound and characterized by adding an element X in molten lead-free solder to form a $(CuX)_6Sn_5$ compound between copper and tin.

(b) A granulation method of $(CUX)_6Sn_5$ compounds for forming $(CUX)_6Sn_5$ compounds separated out in tin and characterized by passing the $(CUX)_6Sn_5$ compound through a multi-perforated plate along with tin.

(c) A method of separation of $(CuX)_6Sn_5$ compounds for separating $(CuX)_6Sn_5$ compounds separated out in tin and characterized by providing a swirling current to tin mixed with $(CuX)_6Sn_5$ compounds to cause precipitation of $(CuX)_6Sn_5$ compounds and separation thereof.

(d) A method of recovering tin for recovering tin from lead-free solder containing eluted copper therein and characterized by recovering tin with the following processes of (1) to (4).

(1) A process of separating out a $(CuX)_6Sn_5$ compound by adding an element X in molten lead-free solder for forming a $(CuX)_6Sn_5$ compound between copper and tin.

(2) A process of granulation of $(CuX)_6Sn_5$ compounds by passing separated $(CuX)_6Sn_5$ compounds through a multi-perforated plate along with tin.

(3) Processes of precipitation and separation of $(CuX)_6Sn_5$ compounds by providing a swirling current to tin mixed with bound $(CuX)_6Sn_5$ compounds.

(4) A process of recovering tin by extracting $(CUX)_6Sn_5$ compounds.

A desirable element X is more than one selected from Ni, Co and Fe in any of the above processes. Further, plural multi-perforated plates have to be used and a desirable bore diameter of a multi-perforated plate provided at an upstream is smaller than that of a multi-perforated plate provided at a downstream.

EFFECT OF THE INVENTION

According to the present invention, tin can be recovered with high efficiency by separating excess copper leached out in a lead-free solder bath. Tin recovered by this means is reutilized as a solder material.

Figure 1:
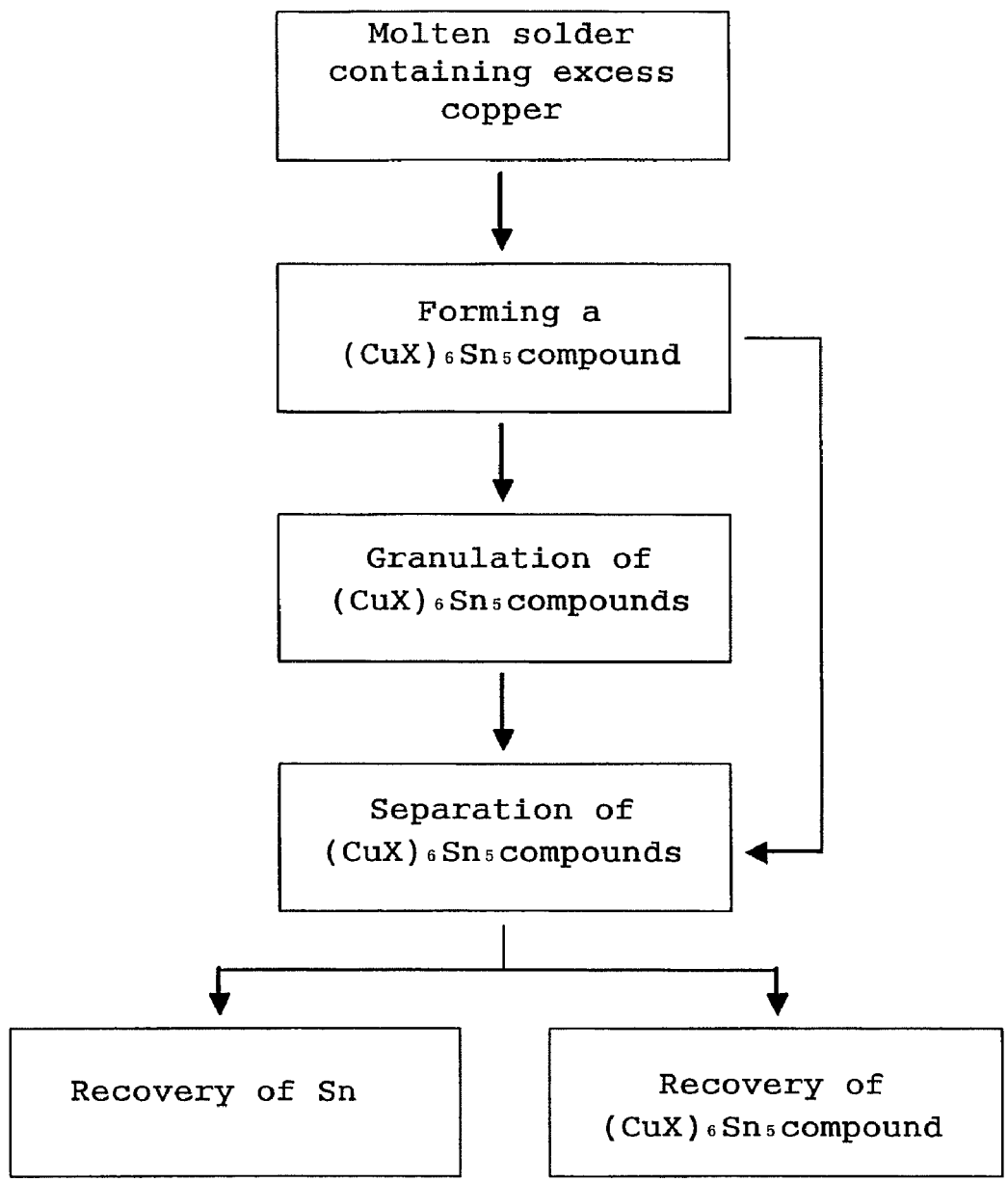
FIG. 1 is view illustrating a brief overview of a tin recovering method with respect to the present invention.

DESCRIPTION OF CODES 1 is a precipitation container
2 is lead-free solders
3 is a $(CuX)_6Sn_5$ compound
4 is a granulation container
5 is a granulator
6 is a formed $(CuX)_6Sn_5$ compound
7-1 is the first multi-perforated plate
7-2 is the second multi-perforated plate
7-3 is the third multi-perforated plate
8 is a multi-perforated plate
9 is a metal plate
10 is a hole
11 is a separation container
12 is tin

BEST MODE FOR OPERATING THE INVENTION

Hereafter, an embodiment of the present invention is described with reference to the drawings.

1. A Tin Recovering Method

FIG. 1 is a view illustrating a brief overview of a tin recovering method with respect to the present invention. As shown in this view as to a recovering method of tin of the present invention, firstly, copper leached out in lead-free solder excessively according to "copper leaching" of a printed board and so on is separated out as a designated compound and in certain instances, the compound is granulated and afterwards, tin is separated out from this compound. Tin is to be reutilized as renewed solder material and copper compounds are to be discarded or reutilized as material of copper, tin and so on by refining.

2. A Method of Separating Out $(CUX)_6Sn_5$ Compounds

Figure 2:
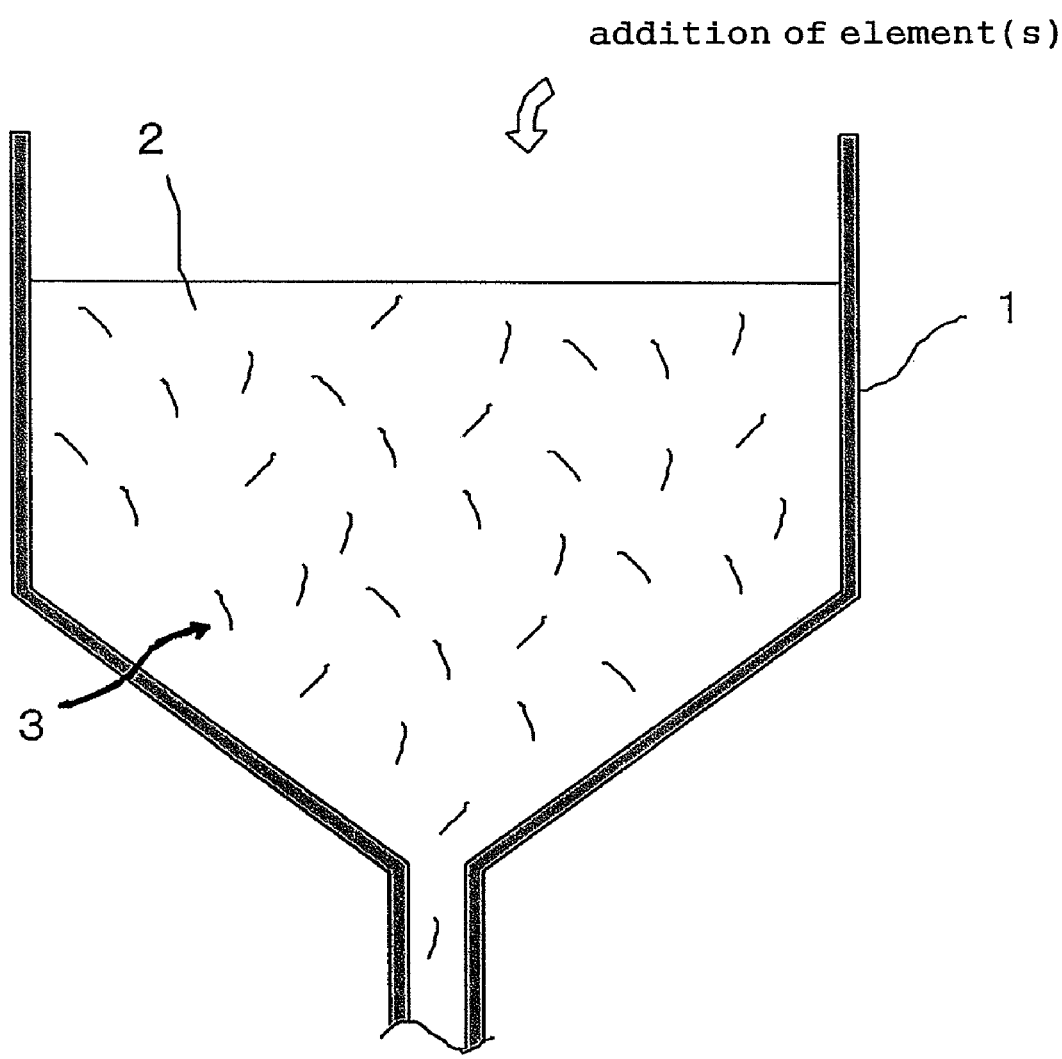
FIG. 2 is a flame format illustrating a separating method of $(CuX)_6Sn_5$ compounds.

FIG. 2 is a flame format illustrating one example of a separating method of $(CuX)_6Sn_5$ compounds. As shown in FIG. 2 with respect to a separating method of the present invention, for example, lead-free solder 2 with copper leached out excessively is flowed in a precipitation container 1 and an appropriate amount of element Xs are added while heating the container to a prescribed temperature range by a heater (not shown in the Fig.). A $(CuX)_6Sn_5$ compound 3 is separated out by addition of an element X. A heating temperature is set above to a dissolution temperature of solder and below to an incorruptible temperature of separated $(CuX)_6Sn_5$ compounds, namely, from 230~250° C. Further, mother alloy, wherein an appropriate amount of element Xs are solved in Sn, can be added as a method of addition of an element X.

An element X can be any element which is solved in Cu but forms a precipitate with Sn. For example, Ni, Co, Fe can be cited. When an appropriate amount of these elements are added, a $(CuX)_6Sn_5$ compound having a crystal structure with a higher melting temperature than solder in molten solder is formed. High purified tin can be recovered by precipitating and removing the $(CuX)_6Sn_5$ compound.

However, since a particle of the $(CuX)_6Sn_5$ compound is small and therefore buoyant, precipitation thereof takes long time. Meanwhile, an inside of a precipitation container has to be maintained a temperature range of 230~250° C. an increase in energy cost is caused. Consequently, the inventor of the present invention came up with a way of removing $(CuX)_6Sn_5$ compounds floated in solder after changing thereof to a form easily recovered. This method is described as below.

3. A Granulation Method of $(CUX)_6Sn_5$ Compounds

Figure 3:
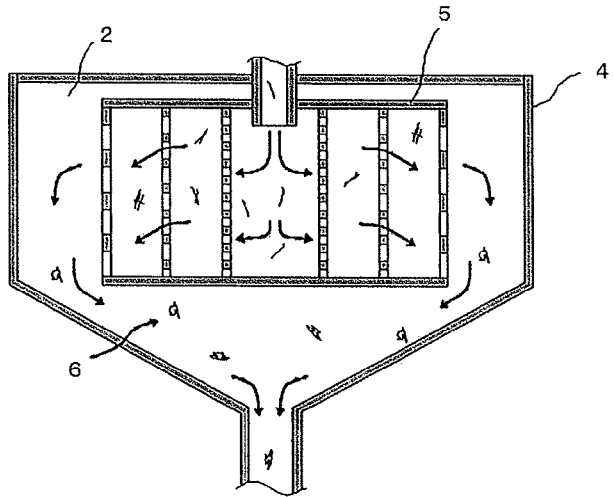
FIG. 3 is a flame format illustrating one example of a granulation method of $(CUX)_6Sn_5$ compounds of the present invention. (a) is an overall flaming view, (b) is a cross-section view of a granulator and (c) is a development view of a multi-multi-perforated plate provided within a granulator.
Figure 3:
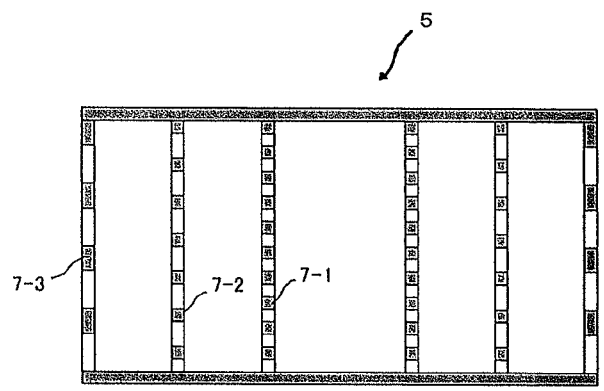
Figure 3:
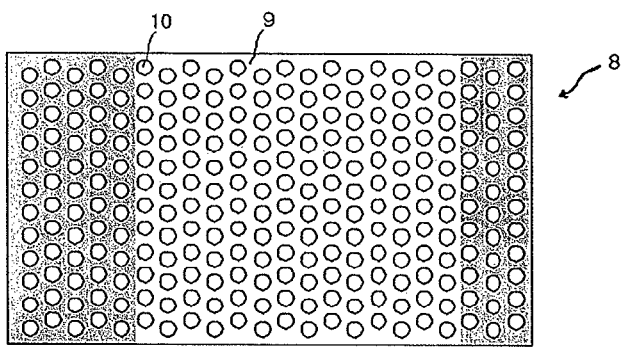

FIG. 3 is a flame format illustrating one example of a granulation method of $(CuX)_6Sn_5$ compounds of the present invention. (a) is an overall flaming view, (b) is a cross-section view of a granulator and (c) is a development view of a multi-perforated plate provided within a granulator. As shown in FIG. 3, (a) with respect to a granulation method of the prevent invention, for example, a granulation container 4, an inside of which a granulator 5 is provided, is used.

A $(CuX)_6Sn_5$ compound 3 is passed through with molten tin 12 in the granulation container 4. The $(CuX)_6Sn_5$ compound 3 drifts downward from near an upper center in the figure, flows from an inside to an outside of holes of multi-perforated plates 7-1, 7-2 and 7-3 composing the granulator 5 and further follows down to an exit. The $(CUX)_6Sn_5$ compound 3 is to bind together every time the $(CUX)_6Sn_5$ compound 3 passes through holes of the multi-perforated plates 7-1, 7-2 and 7-3. As a result, a particle diameter thereof grows larger by degrees.

A granulator 5 is not limited to one shown in the FIG. 3 and for example, a constitution, wherein a single multi-perforated plate is provided and passed, can be adopted. However, considering forming efficiency, plural multi-perforated plates may be prepared and multi-perforated plates 7-1, 7-2 and 7-3 are arranged in a concentric pattern as shown in FIG. 3 (b). Further, a desirable bore diameter of a hole of 7-1 of the first multi-perforated plate provided innermost (namely, at an upstream) is smaller than that of a hole of 7-2 of the second multi-perforated plate and a desirable bore diameter of the hole of 7-2 of the second multi-perforated plate is smaller than that of a hole of 7-3 of the third multi-perforated plate as shown in the FIG. 3 (b). As to a bore diameter, for example, the first perorated plate 7-1 is set to 2 mm, the second multi-perforated plate 7-2 is set to 3 mm and the third multi-perforated plate 7-3 is set to 4 mm.

A desirable temperature inside a granulation container is kept within 230~250° C. by a heater not shown in a figure as well as a temperature inside a container in a precipitation method. A wire netting can be used as a multi-perforated plate but a punching metal, wherein plural holes 10 are punched in a metal plate 9 as shown in FIG. 3 (c), is desirable to use from perspectives of intensity and a bore diameter measure system.

4. A Separating Method of $(CUX)_6Sn_5$ Compounds

Figure 4:
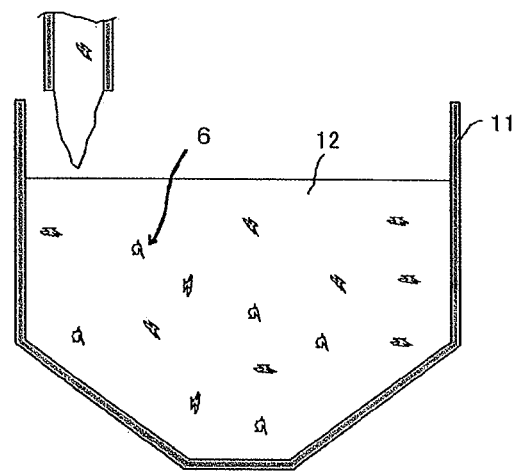
FIG. 4 is a flame format illustrating a separating method of $(CuX)_6Sn_5$ compounds of the present invention.) (a) shows a state of charging, (b) is a state of agitating swirling currents and (c) is a state of cessation of agitating swirling currents.
Figure 4:
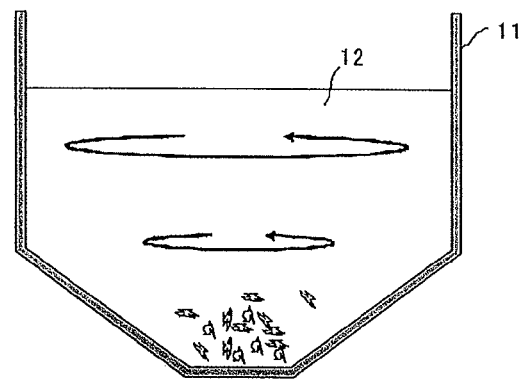
Figure 4:
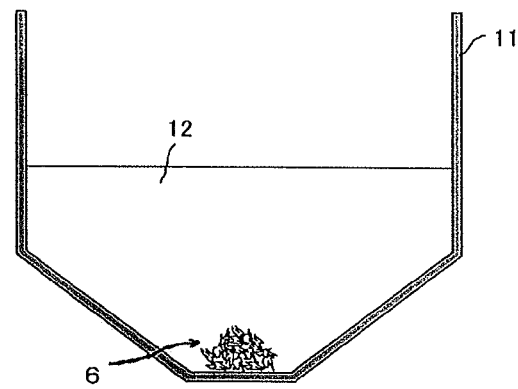

FIG. 4 is a flame format illustrating one example of a separating method of $(CuX)_6Sn_5$ compounds of the present invention. (a) shows a state of charging, (b) is a state of agitating swirling currents and (c) is a state of cessation of agitating swirling currents. As shown in the FIG. 4 with respect to a separating method of the present invention, for example, molten tin 12 mixed with bound $(CuX)_6Sn_5$ compounds is flowed in a separation container 11 as shown in FIG. 4 (*a*), and afterward swirling currents are to be generated as shown in FIG. 4 (*b*).

Then, $(CuX)_6Sn_5$ compounds concentrates gradually at a bottom of a center of the separation container 11. When swirling currents have ceased, $(CuX)_6Sn_5$ compounds precipitate at a bottom of a center of the separation container 11 as shown in FIG. 4 (*c*). In this state, high purified tin is left within the separation container 11 and can be recovered by removing bound $(CUX)_6Sn_5$ compounds from a discharge spout of the separation container 11 not shown in a figure.

A desirable temperature inside the separation container is kept within 230~250° C. by a heater not shown in a figure as well as a temperature inside a container in a precipitation method. In the FIG. 4, processes of charge of the molten tin 12 and agitation of swirling currents are illustrated separately to simplify an explanation but these processes can be conducted simultaneously. More specifically, swirling currents can be occurred within the separation container 11 by adjusting an flow angle of the molten tin 12 mixed with bound $(CuX)_6Sn_5$ compounds. As to a means of generating swirling currents, for example, a method whereby swirling currents are generated within the molten tin 12 mixed with $(CuX)_6Sn_5$ compounds by inserting an agitating equipment from an upper part of the separation container 11 or by adjusting an ejecting direction of a nozzle provided on a side of the separation container 11 can be adopted.

As to a recovering method of the molten tin 12 after removing bound $(CuX)_6Sn_5$ compounds, a method whereby the molten tin 12 can be withdrawn from an upper part of the separation container 11 utilizing a pump can be possible but the pump may be damaged by a temperature of molten solder. Accordingly, after removing bound $(CuX)_6Sn_5$ compounds from a discharge spout, the discharge spout is closed for the meanwhile, and then the molten tin 12 can be discharged in a separate container from bound $(CUX)_6Sn_5$ compounds. Further, a method whereby the molten tin 12 can be recovered by providing a discharge spout for recovering tin near a upper part of a separation container and discharging only supernatant fluid of molten tin can be adopted.

In the above explanation, a method of separating bound $(CuX)_6Sn_5$ compounds is described. Even when a binding process is skipped, $(CuX)_6Sn_5$ compounds can be separated with the same method requiring more time.

Each process is explained hereinbefore, and obviously these processes can be conducted in a continuous fashion. In this instance, tin can be recovered in a recycling factory utilizing a method of this invention by recovering used solder from a dip solder bath or a spout solder bath. Further, this method can be conducted without transferring other place by installing an equipment enabling to conduct a recovering method concerning the present invention beside a dip solder bath or a spout solder bath while operating soldering. The latter case is useful for adjusting a copper concentration within a solder bath since copper leached out excessively can be separated continuously.

INDUSTRIAL APPLICABILITY

According to the present invention, tin can be recovered with high efficiency by separating excess copper leached out in a lead-free solder bath. This recovered tin can be reutilized as a solder material.

The invention claimed is:

1. A method of recovering tin from lead-free solder by separating out copper leached out in lead-free solder as an intermetallic compound characterized by adding an element X to a solder bath to form a $(CuX)_6Sn_5$ compound between copper and tin in molten lead-free solder and removing $(CuX)_6 Sn_5$ compounds to recover tin.

2. A method of recovering tin from lead-free solder according to claim 1, wherein element X is at least one element selected from the group consisting of Ni, Co and Fe.

3. A tin recovering method for recovering tin from lead-free solder with liquated copper therein and characterized by recovering tin with the following processes of (1) to (4):
   (1) separating out a $(CuX)_6Sn_5$ compound by adding an element X forming a $(CuX)_6 Sn_5$ compound between copper and tin in molten lead-free solder;
   (2) binding $(CuX)_6Sn_5$ compounds by passing a separated $(CuX)_6Sn_5$ compound through a multi-perforated plate with tin;
   (3) precipitating and separating $(CuX)_6Sn_5$ compounds by generating swirling currents in tin mixed with bound $(CuX)_6Sn_5$ compounds; and
   (4) recovering tin by removing $(CuX)_6Sn_5$ compounds.

4. A tin recovering method according to claim 3, wherein an element X is at least one element selected from the group of Ni, Co and Fe.

5. A tin recovering method according to claim 3, wherein plural multi-perforated plates are used and a diameter of a multi-perforated plate provided at an upstream is smaller than that of a multi-perforated plate provided at a downstream.

6. A tin recovering method according to claim 4, wherein plural multi-perforated plates are used and a diameter of a multi-perforated plate provided at an upstream is smaller than that of a multi-perforated plate provided at a downstream.

* * * * *

UNITED STATES PATENT AND TRADEMARK OFFICE
CERTIFICATE OF CORRECTION

PATENT NO.       : 7,591,873 B2
APPLICATION NO.  : 11/995955
DATED            : September 22, 2009
INVENTOR(S)      : Tetsuro Nishimura Page 1 of 1

It is certified that error appears in the above-identified patent and that said Letters Patent is hereby corrected as shown below:

Claim 1, Col. 6, Line 19, after "compound" insert -- and --.

Claim 3, Col. 6, Line 28, insert a space after "of".

Claim 3, Col. 6, Line 30, delete the space after "$_6$".

Signed and Sealed this

Twenty-second Day of December, 2009

David J. Kappos
*Director of the United States Patent and Trademark Office*